US009191190B2

(12) United States Patent
Ma

(10) Patent No.: US 9,191,190 B2
(45) Date of Patent: Nov. 17, 2015

(54) METHODS AND APPARATUS FOR DIGITAL HOST-LOCK MODE IN A TRANSCEIVER

(75) Inventor: Stanley Jeh-Chun Ma, Ottawa (CA)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 930 days.

(21) Appl. No.: 13/097,743

(22) Filed: Apr. 29, 2011

(65) Prior Publication Data

US 2012/0275494 A1 Nov. 1, 2012

(51) Int. Cl.
| | |
|---|---|
| *H04B 1/38* | (2015.01) |
| *H04L 5/16* | (2006.01) |
| *H04L 7/00* | (2006.01) |
| *H04B 1/04* | (2006.01) |
| *H03L 7/081* | (2006.01) |
| *H04L 7/02* | (2006.01) |

(52) U.S. Cl.
CPC ............ *H04L 7/0091* (2013.01); *H03L 7/0812* (2013.01); *H04B 1/0475* (2013.01); *H04L 7/02* (2013.01)

(58) Field of Classification Search
None
See application file for complete search history.

(56) References Cited

U.S. PATENT DOCUMENTS

| | | | | |
|---|---|---|---|---|
| 4,839,651 A | * | 6/1989 | Banno | 341/120 |
| 6,900,676 B1 | * | 5/2005 | Tamura | 327/156 |
| 2002/0075980 A1 | * | 6/2002 | Tang et al. | 375/372 |
| 2002/0075981 A1 | * | 6/2002 | Tang et al. | 375/372 |
| 2003/0035504 A1 | * | 2/2003 | Wong et al. | 375/377 |
| 2010/0188129 A1 | | 7/2010 | Ma | |
| 2014/0016928 A1 | * | 1/2014 | Khatana | 398/25 |

* cited by examiner

*Primary Examiner* — Shuwang Liu
*Assistant Examiner* — Gina McKie

(57) ABSTRACT

Methods and apparatus are provided for implementing a digital host-lock mode in a transceiver. The transmitter portion of a transceiver is synchronized to a recovered clock generated by the receiver portion of the transceiver by applying a receiver input signal to a clock and data recovery system in the receiver portion to generate the recovered clock and a frequency offset value. The frequency offset value comprises a digital word indicating a frequency offset between the recovered clock and the receiver input signal. A transmit clock is generated in the transmitter portion that is substantially synchronized to the recovered clock by applying the digital word to a clock signal generator.

22 Claims, 2 Drawing Sheets

METHODS AND APPARATUS FOR DIGITAL HOST-LOCK MODE IN A TRANSCEIVER

FIELD OF THE INVENTION

The present invention relates generally to clock synchronization techniques and, more particularly, to techniques for synchronizing a transmitter clock to a clock recovered by a receiver in a transceiver.

BACKGROUND OF THE INVENTION

A Serializer and Deserializer (SerDes) device is an important building block in high speed computer networks and data communications systems. In applications that use a SerDes device, a clock signal is typically not transmitted with the data signal. Rather, a Clock and Data Recovery (CDR) system in a receiver portion of the SerDes device typically extracts timing information from a received signal and establishes a recovered clock signal. The recovered clock signal is then used to sample the received signal and to detect the transmitted data. The recovered clock signal typically has substantially the same frequency and phase as the received signal.

It is often desired to configure a SerDes device in a host-lock mode, where the transmitter portion of the SerDes device is synchronized to the recovered clock signal generated by the receiver portion of the SerDes device. When the transmitter is synchronized to the recovered clock signal, however, any distortions in the recovered clock signal will impair the transmitted data signal. For example, jitter is an unwanted variation of one or more signal characteristics, such as an interval between successive pulses. Jitter results in the receiver CDR system failing to accurately reproduce the timing information in the recovered clock signal.

In the host-lock mode, any distortion in the recovered clock signal directly and negatively influences the performance of the transmitter. A need therefore exists for improved techniques for synchronizing the transmitter in a SerDes device to the recovered clock signal generated by the local receiver. A further need exists for improved techniques for implementing a host-lock mode that digitally remove the CDR-induced jitter that is inherent in the received signal.

SUMMARY OF THE INVENTION

Generally, methods and apparatus are provided for implementing a digital host-lock mode in a transceiver. In a host-lock mode, the transmitter portion of a SerDes device is synchronized to the recovered clock signal generated by the receiver portion of the SerDes device.

According to one aspect of the invention, the transmitter portion of a transceiver is synchronized to a recovered clock generated by the receiver portion of the transceiver by applying a receiver input signal to a clock and data recovery system in the receiver portion to generate the recovered clock and a frequency offset value. The frequency offset value comprises a digital word indicating an offset between a frequency of the reference clock and a data rate of the receiver input signal. A transmit clock is generated in the transmitter portion that is substantially synchronized to the recovered clock by applying the digital word to a clock signal generator.

According to another aspect of the invention, a transceiver is disclosed that comprises a receiver portion having a clock and data recovery system and a transmitter portion. The clock and data recovery system is substantially synchronized to a receiver input signal, and generates a recovered clock and a frequency offset value. The frequency offset value comprises a digital word indicating an offset between a frequency of the reference clock and a data rate of the receiver input signal. A frequency of a transmit data signal generated by the transmitter portion is substantially synchronized to the receiver portion using the frequency offset value.

Another aspect of the invention provides a clock and data recovery system for use in a transceiver. The disclosed clock and data recovery system comprises means for determining a frequency offset value comprising a digital word indicating an offset between a frequency of the reference clock and a data rate of the receiver input signal; and means for generating a transmit clock for use by a transmitter portion of the transceiver, wherein the transmit clock is substantially synchronized to the recovered clock using the frequency offset value.

A more complete understanding of the present invention, as well as further features and advantages of the present invention, will be obtained by reference to the following detailed description and drawings.

DETAILED DESCRIPTION

The present invention provides methods and apparatus for synchronizing the transmitter in a SerDes device to the recovered clock signal generated by the receiver. According to one aspect of the invention, the CDR-induced jitter that is inherent in the received signal is digitally removed prior to applying the recovered clock signal to the transmitter. The present invention recognizes that in a digital CDR implementation, the frequency offset for the reference clock that is employed by the CDR system to generate the recovered clock signal is available as a digital word. Thus, according to a further aspect of the invention, a host-lock mode is achieved by providing the receiver digital frequency offset word to the transmitter as a digital frequency offset word. In this manner, the transmitter can generate the transmit clock from the digital frequency offset word. In addition, the receiver digital frequency offset word can be digitally filtered to remove CDR-induced jitter and other noise from the receiver digital frequency offset word. In this manner, the transmitter demonstrates a host-lock mode jitter performance that is comparable to a transmitter that is operating in a non-host-lock mode.

Figure 1:
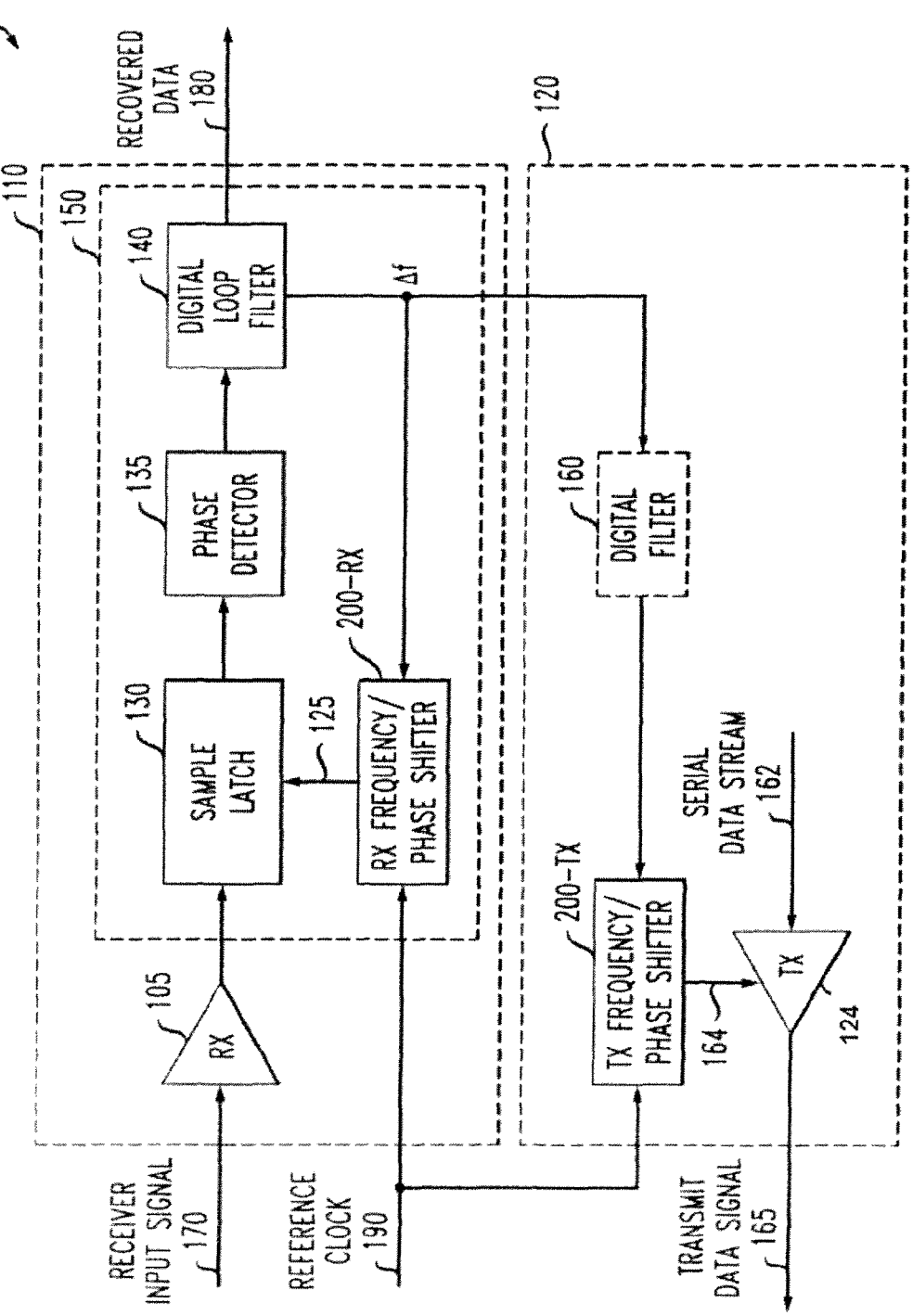
FIG. 1 illustrates an exemplary transceiver in which the present invention can operate.

FIG. 1 illustrates an exemplary transceiver 100 in which the present invention can operate. The exemplary transceiver 100 comprises a receiver portion 110 and a transmitter portion 120. The receiver portion 110 includes a CDR system 150 to recover the clock and data from the receiver input signal 170. The CDR system 150 generates a recovered clock signal 125 having substantially the same frequency and phase as the receiver input signal 170. The recovered clock signal 125 is then used to sample the receiver input signal 170 using a sample latch 130 and to detect the transmitted data to generate recovered data 180. The sample latch 130 samples the receiver input signal 170 at the output of a receiver buffer 105.

The sampled output of the sample latch 130 is processed by a phase detector 135 to determine the phase of the incoming signal. The output of the phase detector 135 is filtered by a digital loop filter 140 and a frequency offset value, $\Delta f$, is fed back to a receiver (RX) frequency/phase shifter 200-RX, discussed further below. The frequency offset value, Δf, indicates the difference between the frequency of the reference clock signal 190 and the data rate of the receiver input signal 170. The frequency offset value, Δf, is generated by the phase detector 135 and associated logic, in a known manner. In one typical implementation, the frequency offset value, Δf, is a control voltage that is applied to a voltage controlled oscillator (VCO). Typically, the input voltage to the VCO is controlled by a digital-to-analog converter (DAC), and the frequency offset value, Δf, is the input to the DAC, in a known manner.

As shown in FIG. 1, a reference clock 190 is also applied to the receiver (RX) frequency/phase shifter 200-RX, together with the digital frequency offset value, Δf, to generate a recovered clock signal 125 having substantially the same frequency as the receiver input signal 170. An exemplary implementation of a suitable RX frequency/phase shifter 200-RX is discussed further below in conjunction with FIG. 2. Generally, the exemplary frequency/phase shifter 200-RX generates the recovered clock signal 125 based on the reference clock 190 and the frequency offset value, Δf.

As previously indicated, the present invention recognizes that in a digital CDR implementation, the frequency offset value, Δf, from the receiver portion 110 is available as a digital word and can be used to synchronize the local transmitter portion 120 in a host-lock mode with reduced jitter.

As shown in FIG. 1, the exemplary transmitter portion 120 includes a buffer 124 to convert a serial data stream 162 to a transmit data signal 165 for transmission, using a transmit clock 164 that is generated by a transmitter (TX) frequency/phase shifter 200-TX, as discussed further below in conjunction with FIG. 2. In one exemplary implementation, the TX frequency/phase shifter 200-TX is implemented using similar circuitry to the RX frequency/phase shifter 200-RX.

The TX frequency/phase shifter 200-TX receives the frequency offset value, Δf, from the receiver portion 110 as a digital word. The frequency offset value, Δf, is used in accordance with the present invention to synchronize the local transmitter 120 in a host-lock mode to the recovered clock signal 125 generated by the local receiver 110. As shown in FIG. 1, the frequency offset value, Δf is optionally filtered by a digital filter 160, such as a low pass filter, to smooth the frequency offset value, Δf, values and thereby reduce jitter. While the digital filter 160 is shown in the exemplary embodiment of FIG. 1 within the transmitter portion 120, the digital filter 160 could alternatively be a part of the receiver portion 110.

Figure 2:
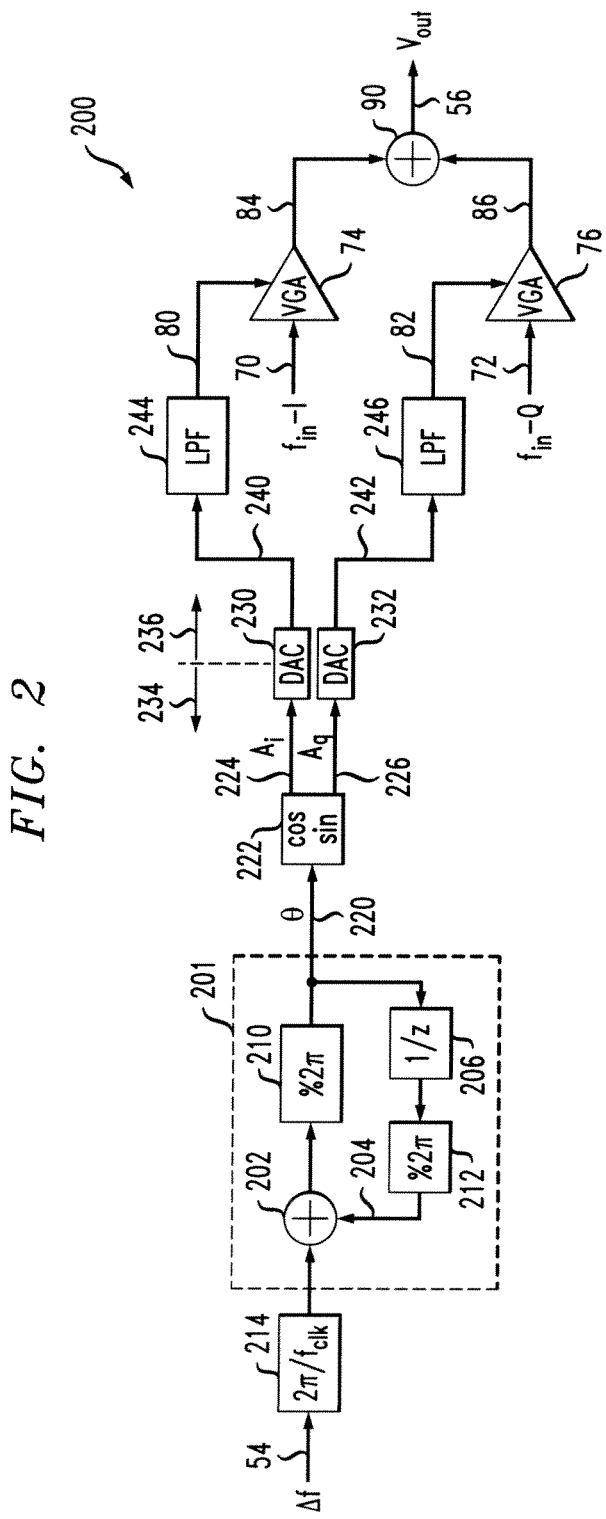
FIG. 2 illustrates an exemplary frequency/phase shifter that can be used as the frequency/phase shifter in the transmitter portion and/or receiver portion of the exemplary transceiver of FIG. 1.

FIG. 2 illustrates an exemplary frequency/phase shifter 200 that can be used as the RX frequency/phase shifter 200-RX and/or the TX frequency/phase shifter 200-TX of FIG. 1. The frequency/phase shifter 200 may be implemented, for example, in accordance with the teachings of U.S. Patent Application Publication No. 2010/0188129, entitled "Method and Apparatus for Applying Clock Phase and Frequency Offset," incorporated by reference herein. Generally, the frequency/phase shifter 200 of FIG. 2 can offset the phase or frequency of an applied clock signal without the need to directly modify the clock source. As discussed herein, the present invention employs the exemplary frequency/phase shifter 200 to generate a clock signal based on an applied reference clock signal 190 and the digital frequency offset value, Δf, computed by the CDR system 150 of FIG. 1. For a more detailed discussion of the exemplary frequency/phase shifter 200 of FIG. 2, see U.S. Patent Application Publication No. 2010/0188129.

The reference clock 190 of FIG. 1 comprises an in-phase phasor portion 70 ($f_{in}$-I) and a quadrature phasor portion 72 ($f_{in}$-Q), in a well known manner. The in-phase phasor 70 and quadrature phasor 72 of the reference clock 190 may be obtained in any suitable manner. For example, the in-phase phasor 70 and quadrature phasor 72 may be directly available from a PLL, or they may be obtained from a single clock signal using a quadrature delay circuit (not shown), such as a polyphase filter, a gyrator, or a delay locked loop, in a known manner.

As shown in FIG. 2, the amplitude of the in-phase phasor portion 70 ($f_{in}$-I) and the quadrature phasor portion 72 ($f_{in}$-Q) of the reference clock 190 are each modulated or otherwise varied in variable gain amplifiers 74 and 76, respectively, under the control of modulation control signals 80 and 82, discussed below. The modulated in-phase phasor 84 and quadrature phasor 86 at the outputs of variable gain amplifiers 74 and 76, respectively, are combined in a summer 90 to form a frequency modulated output clock 56 ($V_{out}$), which is employed by the present invention as the transmit clock 164. The functionality of the variable gain amplifiers 74 and 76 and the summer 90 may be provided in any suitable manner. For example, the variable gain amplifiers 74 and 76 and the summer 90 may be implemented using a Gilbert cell mixer, or with discrete amplifiers and summer.

The frequency modulation profile in the modulation control signals 80 and 82 in one particular embodiment is constructed in the digital domain based on a spreading waveform on the digital frequency offset value, Δf, received from the receiver portion 110 and applied to input 54 of the exemplary frequency/phase shifter 200 of FIG. 2. An integrator 201 is used to obtain the phase offset from the frequency of the spreading waveform 54. The spreading waveform 54 specifies the desired frequency offset, and the integrator 201 calculates the phase offset to be applied as a function of time to the reference clock 190 to achieve the desired frequency offset. The integrator 201 may be implemented in any suitable manner. For example, an accumulator 202 may be used to combine the spreading waveform 54 with a feedback signal 204 that has been delayed by a delay element 206. Scaling factors 210 and 212 shown in FIG. 2 in the accumulator 202 indicate that the accumulator 202 wraps around when it reaches a maximum value, rather than accumulating infinitely.

The spreading waveform 54 may also be scaled by a scaling factor 214 before integration as desired to maintain suitable output levels at the phase signal output 220 of the integrator 201. The phase signal output 220 is divided into two phasor components in a quadrature delay circuit 222. The quadrature delay circuit 222 may be implemented in any manner to generate an in-phase phasor 224 ($A_i$) and a quadrature phasor 226 ($A_q$) from the phase signal output 220. In one particular embodiment, the quadrature delay circuit 222 is implemented in the digital domain using a lookup table that looks up the sine and cosine of the input phase to obtain the $A_i$ and $A_q$ amplitude coefficients. In other embodiments, the quadrature delay circuit 222 is implemented in the analog domain using a polyphase filter, a gyrator, or a delay locked loop.

The in-phase and quadrature phasors $A_i$ and $A_q$ (224, 226) from the phase signal output 220 are converted from the digital domain to the analog domain in digital to analog converters (DACs) 230 and 232. In the embodiment illustrated in FIG. 2, the elements on the incoming side 234 of the DACs 230 and 232 are in the digital domain, and the elements on the outgoing side 236 of the DACs 230 and 232 are in the analog domain. Various other embodiments may be implemented entirely in the digital domain, entirely in the analog domain, or in any desired combination thereof, as would be apparent to a person of ordinary skill in the art. The analog in-phase phasor $A_i$ 240 and the analog quadrature phasor $A_q$ 242 may be filtered in low pass filters 244 and 246, respectively, to smooth the waveforms produced by the DACs 230 and 232. The resulting smoothed analog in-phase and quadrature phasors $A_i$ and $A_q$ are then used as the modulation control signals 80 and 82, respectively, to control the gain applied by the variable gain amplifiers 74 and 76 to the in-phase and quadrature phasors 70 and 72 of the input reference clock signal 190. The amplitude modulated phasors 84 and 86 are then combined to form the output clock 56 that has had a phase offset applied based on the spreading waveform 54, or a frequency offset applied if the spreading waveform 54 applies a continuous change. It is again noted that the output clock 56 is employed by the present invention as the transmit clock 164.

In the exemplary embodiment of FIG. 2, where everything to the incoming side 234 of the DACs 230 and 232 are in the digital domain, the spreading waveform 54 is a multi-bit digital input signal that carries an indication of the desired frequency shift. Any value other than zero changes the in-phase and quadrature phasors 224 and 226 on a continuous basis. The apparatus 200 for offsetting the phase or frequency of a clock signal can be used to apply a frequency offset by continuously applying a non-zero spreading waveform 54, or to apply a phase offset by applying anon-zero pulse on the spreading waveform 54 just long enough to achieve the desired phase offset.

As previously indicated, the variable gain amplifiers 74 and 76 and the summer 90 may be implemented using a Gilbert cell mixer. In one embodiment, the variable gain amplifiers 74 and 76 and the summer 90 comprise a single side-band Gilbert cell mixer that is operated in the linear region, with inputs connected to complementary in-phase and quadrature phasors of the input clock and complementary amplitude coefficients for the in-phase and quadrature phasors of the phase signal.

The digital filter 160 can be designed so that the CDR noise is filtered while allowing the slow spread-spectrum frequency that may be seen on the receiver to pass through to the transmitter. In this way, the present invention supports spread-spectrum signals.

In one example, the method and apparatus may be used as a spread spectrum generator that is applied to each channel of a serializer/deserializer (SerDes) in the physical layer serial interface of a Serial Advanced Technology Attachment (SATA) storage device. A single master clock PLL may therefore be used to generate a master clock signal that is provided to each of a number of data channels. A spread spectrum generator is connected to the clock signal in each data channel to provide independent continuous modulation of the data rate by small amounts in each channel. In this manner, each channel can have independent control of the spread spectrum functionality without the need for multiple PLLs. In this example, the spread spectrum generators may be used in the transmitter portion 120 or receiver portion 110 or both.

As previously indicated, the arrangements of CDR circuitry and associated clock generation circuitry, as described above in conjunction with FIGS. 1 and 2, provide a number of advantages relative to conventional arrangements. As indicated above, the disclosed techniques for implementing a host-lock mode digitally remove the CDR-induced jitter that is inherent in the received signal.

Again, it should be emphasized that the above-described embodiments of the invention are intended to be illustrative only. In general, the exemplary CDR circuitry and associated clock generation circuitry can be modified, as would be apparent to a person of ordinary skill in the art, to synchronize a transmitter portion of a transceiver to the recovered clock generated by the receiver portion of the transceiver. In addition, the disclosed techniques for implementing a host-lock mode can be employed in any CDR environment where timing information is extracted by a receiver from a receiver input signal.

While exemplary embodiments of the present invention have been described with respect to digital logic blocks, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit, micro-controller, or general-purpose computer. Such hardware and software may be embodied within circuits implemented within an integrated circuit.

In an integrated circuit implementation of the invention, multiple integrated circuit dies are typically formed in a repeated pattern on a surface of a wafer. Each such die may include a device as described herein, and may include other structures or circuits. The dies are cut or diced from the wafer, then packaged as integrated circuits. One skilled in the art would know how to dice wafers and package dies to produce packaged integrated circuits. Integrated circuits so manufactured are considered part of this invention.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

It is to be understood that the embodiments and variations shown and described herein are merely illustrative of the principles of this invention and that various modifications may be implemented by those skilled in the art without departing from the scope and spirit of the invention.

I claim:

1. A method for synchronizing a transmitter portion of a transceiver to a recovered clock generated by a receiver portion of the transceiver, comprising:

applying a receiver input signal to a clock and data recovery system in said receiver portion to generate said recovered clock and a frequency offset value, wherein said frequency offset value comprises a digital word indicating an offset between a frequency of a reference clock and a data rate of the receiver input signal; and generating a transmit clock in said transmitter portion that is substantially synchronized to said recovered clock by applying said digital word to a clock signal that comprises a frequency modulator having a frequency offset value input, the frequency modulator comprising an integrator having an input and an output, the input of the integrator being connected to the frequency offset value input, wherein the integrator further comprises an accumulator having a first input, second input, and an output, the first input of the integrator being connected to the frequency offset value input, wherein the integrator further comprises a delay element having an input connected to the accumulator output and an output connect to the second input of the accumulator.

2. The method of claim 1, wherein said clock and data recovery system comprises a latch to sample data in said receiver input signal.

3. The method of claim 1, wherein said transmitter portion and said receiver portion are in a host-lock mode.

4. The method of claim 1, wherein said clock signal generator is a frequency/phase shifting circuit.

5. The method of claim 1, wherein the frequency modulator further comprises a first digital to analog converter having an input and an output, the input being connected to a first output of a quadrature delay circuit; and a second digital to analog converter having an input and an output, the input being connected to a second output of the quadrature delay circuit.

6. A transceiver, comprising:
a clock and data recovery system in a receiver portion, wherein said clock and data recovery system is substantially synchronized to a receiver input signal, wherein said clock and data recovery system generates a recovered clock and a frequency offset value, wherein said frequency offset value comprises a digital word indicating an offset between a frequency of a reference clock and a data rate of the receiver input signal; and
a transmitter portion for transmitting a transmit data signal, wherein a frequency of said transmit data signal is substantially synchronized to said receiver portion using said digital word, wherein said transmitter portion comprises a clock signal generator and said frequency offset value is applied to said clock signal generator wherein said clock signal generator comprises a frequency modulator having a frequency offset value input, and wherein the frequency modulator further comprises a first digital to analog converter having an input and an output, the input of the first digital to analog converter being connected to a first output of a quadrature delay circuit and a second digital to analog converter having an input and an output, the input of the second digital to analog converter being connected to a second output of the quadrature delay circuit.

7. The transceiver of claim 6, wherein said clock and data recovery system comprises a latch to sample data in said receiver input signal.

8. The transceiver of claim 6, wherein said transmitter portion and said receiver portion are in a host-lock mode.

9. The transceiver of claim 6, wherein said clock signal generator is a frequency/phase shifting circuit.

10. The transceiver of claim 9, wherein the frequency modulator comprises an integrator having an input and an output, the input being connected to the frequency offset value input.

11. The transceiver of claim 10, wherein the integrator comprises an accumulator having a first input, a second input and an output, the first input being connected to the frequency offset value input and the output comprising the integrator output, and a delay element having an input connected to the accumulator output and an output connected to the second input of the accumulator.

12. The transceiver of claim 6, wherein one or more of said clock and data recovery system and said transmitter portion are implemented in one of an integrated circuit, a digital signal processor, a microprocessor, a micro-controller, and a general-purpose computer.

13. A clock and data recovery system for use in a transceiver, comprising:
means for determining a frequency offset value comprising a digital word indicating an offset between a frequency of a reference clock and a data rate of a receiver input signal; and
means for generating a transmit clock for use by a transmitter portion of said transceiver, wherein said transmit clock is substantially synchronized to said recovered clock using said digital word, wherein said transmitter portion comprises a clock signal generator and said frequency offset value is applied to said clock signal generator wherein said clock signal generator comprises a frequency modulator having a frequency offset value input, and wherein the frequency modulator further comprises a first digital to analog converter having an input and an output, the input of the first digital to analog converter being connected to a first output of a quadrature delay circuit and a second digital to analog converter having an input and an output, the input of the second digital to analog converter being connected to a second output of the quadrature delay circuit.

14. The clock and data recovery system of claim 13, wherein said transmitter portion and said receiver portion are in a host-lock mode.

15. The clock and data recovery system of claim 13, wherein one or more of said means for determining a frequency offset value and said means for generating a transmit clock are implemented in one of an integrated circuit, a digital signal processor, a microprocessor, a micro-controller, and a general-purpose computer.

16. A transmitter for use in a transceiver that also includes a receiver having a clock and data recovery system that generates a recover clock and a frequency offset value indicating an offset between a frequency of a reference clock and a data rate of the receiver input signal, the transmitter comprising:
a transmitter portion for transmitting a transmit data signal, wherein a frequency of the transmit data signal is substantially synchronized to the receiver portion using the frequency offset value; and
a clock signal generator configured to have the frequency offset value applied thereto, wherein said clock signal generator comprises a frequency modulator having a frequency offset value input, and wherein the frequency modulator further comprises a first digital to analog converter having an input and an output, the input of the first digital to analog converter being connected to a first output of a quadrature delay circuit and a second digital to analog converter having an input and an output, the input of the second digital to analog converter being connected to a second output of the quadrature delay circuit.

17. The transmitter of claim 16, wherein said clock and data recovery system comprises a latch to sample data in said receiver input signal.

18. The transmitter of claim 16, wherein said transmitter portion is in a host-lock mode with the receiver.

19. The transmitter of claim 16, wherein said clock signal generator is a frequency/phase shifting circuit.

20. The transmitter of claim 19, wherein the frequency modulator comprises an integrator having an input and an output, the input being connected to the frequency offset value input.

21. The transmitter of claim 20, wherein the integrator comprises an accumulator having a first input, a second input and an output, the first input being connected to the frequency offset value input and the output comprising the integrator output, and a delay element having an input connected to the accumulator output and an output connected to the second input of the accumulator.

22. The transmitter of claim 16, wherein the transmitter portion is implemented in one of an integrated circuit, a digital signal processor, a microprocessor, a micro-controller, and a general-purpose computer.

* * * * *